US011609496B2

United States Patent
Chang et al.

(10) Patent No.: US 11,609,496 B2
(45) Date of Patent: Mar. 21, 2023

(54) METHOD OF FORMING PATTERNED POLYIMIDE LAYER

(71) Applicant: ECHEM SOLUTIONS CORP., Taoyuan (TW)

(72) Inventors: Ting-Wei Chang, Taoyuan (TW); Ming-Che Chung, Taoyuan (TW)

(73) Assignee: ECHEM SOLUTIONS CORP., Taoyuan (TW)

( * ) Notice: Subject to any disclaimer, the term of this patent is extended or adjusted under 35 U.S.C. 154(b) by 235 days.

(21) Appl. No.: 16/909,936

(22) Filed: Jun. 23, 2020

(65) Prior Publication Data

US 2020/0319554 A1 Oct. 8, 2020

Related U.S. Application Data

(62) Division of application No. 16/517,666, filed on Jul. 22, 2019, now abandoned.

(30) Foreign Application Priority Data

Sep. 13, 2018 (TW) .................... 107132323

(51) Int. Cl.
*G03F 7/039* (2006.01)
*G03F 7/004* (2006.01)
(Continued)

(52) U.S. Cl.
CPC .......... *G03F 7/039* (2013.01); *G03F 7/0045* (2013.01); *G03F 7/0048* (2013.01); *G03F 7/162* (2013.01);
(Continued)

(58) Field of Classification Search
None
See application file for complete search history.

(56) References Cited

U.S. PATENT DOCUMENTS 4,397,937 A * 8/1983 Clecak .................... G03F 7/022
430/326
4,431,478 A * 2/1984 Yamaoka ............... C09K 13/00
216/48
(Continued)

FOREIGN PATENT DOCUMENTS

CN 101528653 A 9/2009
EP 0295626 A2 6/1988
(Continued)

OTHER PUBLICATIONS

"Basic chemistry of Novolaks", (Chapter 3. pp. 29-69) in Dammel, Ralph. Diazonaphthoquinone-Based Resists. Bellingham, Washington: SPIE Optical Engineering Press, 1993.*
(Continued)

*Primary Examiner* — Martin J Angebranndt
(74) *Attorney, Agent, or Firm* — Pai Patent & Trademark Law Firm; Chao-Chang David Pai

(57) ABSTRACT

The present invention provides a method for forming a patterned polyimide layer with the use of a positive photoresist composition. The composition comprises a cresol-type novolac resin, a diazonaphthoquinone-based sensitizer and an organic solvent; based on the cresol-type novolac resin with a total amount of 100 parts by weight, the amount of the diazonaphthoquinone-based sensitizer ranges from 40 parts to 60 parts by weight, the amount of the free cresol in the cresol-type novolac resin is lower than 2 parts by weight, and the alkaline dissolution rate (ADR) of the cresol-type novolac resin in an aqueous solution of 3.5 wt % to 7 wt % tetramethylammonium hydroxide is lower than 285 Å/s. The positive photoresist composition has excellent chemical resistance to the polyimide stripper, and can specifically improve the protective ability of the photoresist layer to the low-dielectric polyimide layer, thereby optimizing the
(Continued)

manufacturing process and quality of the patterned polyimide layer.

15 Claims, 1 Drawing Sheet

(51) Int. Cl.
  *G03F 7/16* (2006.01)
  *G03F 7/20* (2006.01)
  *G03F 7/42* (2006.01)
  *G03F 7/32* (2006.01)
  *G03F 7/38* (2006.01)

(52) U.S. Cl.
  CPC .............. *G03F 7/168* (2013.01); *G03F 7/20* (2013.01); *G03F 7/322* (2013.01); *G03F 7/38* (2013.01); *G03F 7/422* (2013.01)

(56) References Cited

U.S. PATENT DOCUMENTS

| | | | |
|---|---|---|---|
| 4,529,682 A | 7/1985 | Toukhy | |
| 4,530,895 A | 7/1985 | Simon et al. | |
| 4,666,735 A | 5/1987 | Hoover et al. | |
| 4,731,319 A | 3/1988 | Kohara et al. | |
| 4,781,441 A | 11/1988 | Kanbe et al. | |
| 4,797,346 A | 1/1989 | Yamamoto et al. | |
| 4,869,781 A * | 9/1989 | Euen | H01L 21/32105 257/E21.312 |
| 5,173,392 A | 12/1992 | Miersch et al. | |
| 5,183,534 A * | 2/1993 | Fjare | H01L 21/31133 216/48 |
| 5,374,503 A * | 12/1994 | Sachdev | G03F 7/0035 430/314 |
| 5,643,471 A * | 7/1997 | Onishi | G02F 1/13394 216/33 |
| 5,674,657 A * | 10/1997 | Tan | G03F 7/0236 430/192 |
| 5,719,004 A | 2/1998 | Lu et al. | |
| 5,955,779 A | 9/1999 | Matsuura et al. | |
| 6,365,321 B1 | 4/2002 | Chen et al. | |
| 6,723,484 B1 * | 4/2004 | Tomikawa | G03F 7/0233 430/192 |
| 2003/0207195 A1 | 11/2003 | Eilbeck et al. | |
| 2007/0205783 A1 | 9/2007 | Sato et al. | |
| 2010/0130886 A1 * | 5/2010 | Kaneto | A61B 5/150022 600/583 |
| 2011/0284268 A1 * | 11/2011 | Palaniswamy | H05K 3/28 156/60 |
| 2013/0056653 A1 | 3/2013 | Hatakeyama et al. | |
| 2014/0242504 A1 | 8/2014 | Liu et al. | |

FOREIGN PATENT DOCUMENTS

| | | | |
|---|---|---|---|
| JP | P2001-296654 A | 10/2001 | |
| JP | 2005306987 A * | 11/2005 | |
| JP | P3814961 B2 | 8/2006 | |
| JP | 4068260 B2 * | 3/2008 | ........... G03F 7/0236 |
| JP | P5507380 B2 | 5/2014 | |
| KR | 10-1286905 B1 | 7/2013 | |
| TW | 200736826 A | 10/2007 | |
| TW | 201716868 A | 5/2017 | |
| WO | 2016/175103 A1 | 11/2016 | |
| WO | 2017/038979 A1 | 3/2017 | |

OTHER PUBLICATIONS

Novakov et al., "Synthesis of novolac resins. I. Influence of the chemical structure of the monomers and the reaction conditions on some properties of novolac oligomers", Chemtronics, Dec. 1989, vol. 4.

* cited by examiner

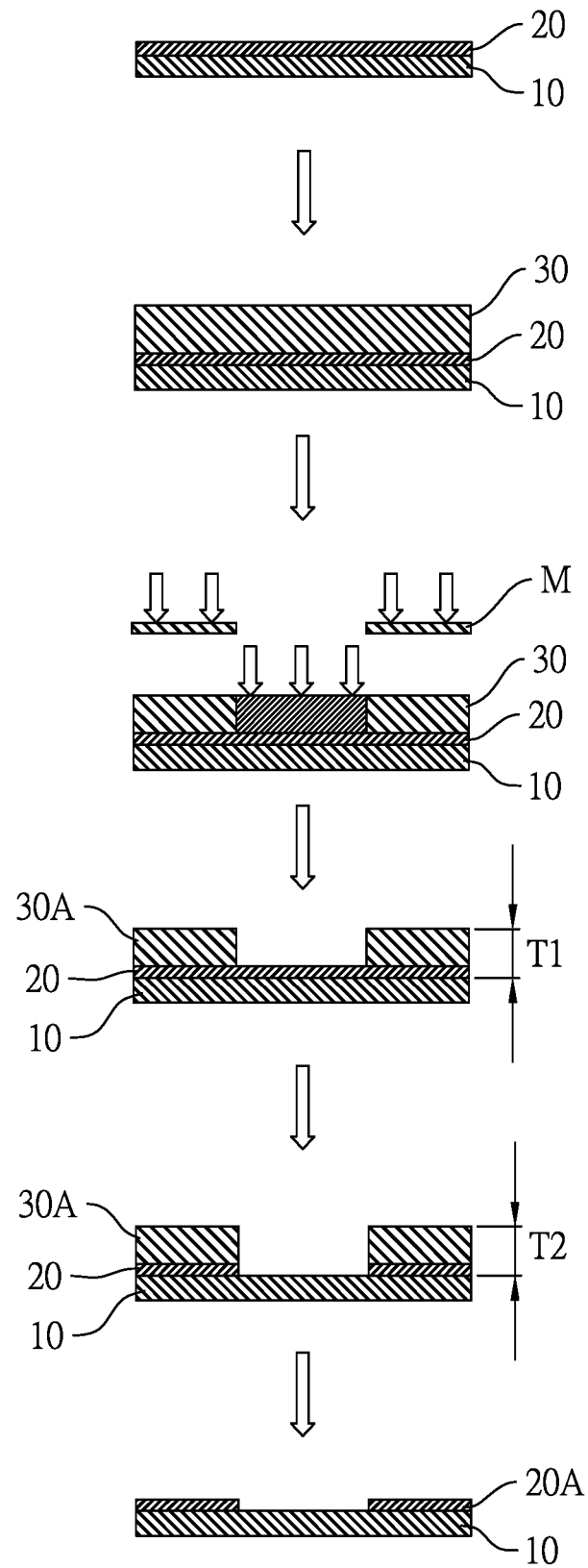

METHOD OF FORMING PATTERNED POLYIMIDE LAYER

CROSS-REFERENCE TO RELATED APPLICATION

This is a divisional application of application Ser. No. 16/517,666, filed Jul. 22, 2019. Pursuant to 35 U.S.C. § 119(a), this application claims the benefit of the priority to Taiwan Patent Application No. 107132323, filed Sep. 13, 2018. The content of the prior application is incorporated herein by its entirety.

BACKGROUND OF THE INVENTION

1. Field of the Invention

The present invention relates to a photoresist composition and a method of patterning thereof, and more particularly to a positive photoresist composition and a method of forming a patterned polyimide layer.

2. Description of the Prior Arts

In a redistribution layer (RDL) process in the semiconductor industry, the input and output (I/O) pads of the original design can be changed by way of coating a polyimide film on a silicon wafer through wafer-level metal wiring process and bumping process, allowing the IC to be applied to various component modules.

In the semiconductor manufacturing process, the patterned polyimide film is currently realized by dry etching or wet etching. For patterning, dry etching can remove the polyimide film of a predetermined region by using plasma; however, the electrical properties of the low-dielectric polyimide film may be changed by plasma etching, even with a short circuit.

Wet etching process can be performed by using an appropriate positive photoresist or negative photoresist according to different requirements. Taking a positive photoresist as an example, a positive photoresist film can be used to protect a polyimide film in a specific region, and after exposure and development, the polyimide film without the protection of the positive photoresist film are stripped by a specific polyimide stripper, and then the positive photoresist film is also stripped to achieve the purpose of patterning. However, most of the current positive photoresist films on the market have poor chemical resistance to the polyimide stripper, so that the positive photoresist film cannot protect the polyimide film as expected, and even affects the quality of the patterned polyimide film.

SUMMARY OF THE INVENTION

In view of the above, an objective in one embodiment is to provide an improved positive photoresist composition, which can greatly improve the chemical resistance of the photoresist layer to the existing polyimide stripper, thereby enhancing the protective ability of the photoresist layer to the low-dielectric polyimide layer, so as to achieve the purpose of forming a patterned polyimide layer.

In addition, another objective in one embodiment is to enable the photoresist layer formed by the positive photoresist composition to be completely and easily stripped or removed by the photoresist remover, so as to ensure its high peelability and avoid undesired photoresist residue after wet etching.

To achieve the aforementioned objective, the disclosure provides a positive photoresist composition comprising: a cresol-type novolac resin, a diazonaphthoquinone-based sensitizer and an organic solvent. Based on the cresol-type novolac resin with a total amount of 100 parts by weight, the amount of the diazonaphthoquinone-based sensitizer ranges from 40 parts to 60 parts by weight, the content of the free cresol in the cresol-type novolac resin is lower than 2 percent by weight (wt %), and the alkaline dissolution rate (ADR) of the cresol-type novolac resin in an aqueous solution of 3.5 wt % to 7 wt % tetramethylammonium hydroxide is lower than 285 Å/s.

By adopting the aforementioned technical means, the positive photoresist composition has excellent chemical resistance to the polyimide stripper and thus can specifically improve the protective ability of the positive photoresist layer to the low-dielectric polyimide layer, and the positive photoresist layer is much easier to be peeled off and thereby this can avoid undesired photoresist residues in the patterning process. Accordingly, the positive photoresist composition can specifically improve the properties of the conventional photoresist composition, thereby optimizing the manufacturing process and quality of the patterned polyimide layer.

Preferably, in the positive photoresist composition in accordance with one or more embodiments, on the basis of the cresol-type novolac resin with a total amount of 100 parts by weight, the amount of the organic solvent is 100 parts to 500 parts by weight, preferably 170 to 230 parts by weight; the diazonaphthoquinone-based sensitizer is used in an amount of from 45 parts to 55 parts by weight. By controlling the amounts of the components in the positive photoresist composition, precipitation of the sensitizer is mitigated or prevented, so as to ensure applicability of the positive photoresist composition.

Preferably, in the positive photoresist composition in accordance with one or more embodiments, the ADR of the cresol-type novolac resin in an aqueous solution of 3.5 wt % to 5 wt % tetramethylammonium hydroxide is lower than 285 Å/s. More specifically, the ADR of the cresol-type novolac resin in an aqueous solution of 3.5 wt % tetramethylammonium hydroxide is lower than 285 Å/s.

Preferably, in the positive photoresist composition, the content of free cresol in the cresol-type novolac resin may be less than 1.8 wt %, more preferably, between 1 wt % and 1.8 wt %, and then more preferably, between 1.5 wt % and 1.7 wt %.

Preferably, the cresol-type novolac resin may have a weight average molecular weight of 10,000 to 40,000 in the positive photoresist composition.

Preferably, in the positive photoresist composition, the molar ratio of meta-cresol:para-cresol in the cresol-type novolac resin may range from 3:7 to 7:3.

Preferably, the diazonaphthoquinone-based sensitizer may be, but not limited to, an ester compound obtained by reacting a diazonaphthoquinone-based compound with a phenol-containing compound, for example, 1-phenol-4-(1-(4-(2-(4-(phenol)methyl)phenyl)propyl-2)phenyl)-1-(4-phenolyl phenyl)ethyl)phenyl diazonaphthoquinone derivative, tris(4-hydroxyphenyl)methyl diazonaphthoquinone derivative, tris(4-hydroxyphenyl)ethyl diazonaphthoquinone derivative, and 1,4-bis[1-(4-hydroxyphenyl)-1-methylethyl] phenyl diazonaphthoquinone derivative.

Preferably, the positive photoresist composition may further comprise an additive according to various demands, the additive may be, but not limited to, a fluorosurfactant, a surface flattening agent, a plasticizer, a stabilizer and so on.

Take the fluorosurfactant as an example, when the positive photoresist composition contains the fluorosurfactant, the amount of the fluorosurfactant is between 0.1 part by weight to 0.5 part by weight based on 100 parts by weight of the cresol-type novolac composition, preferably 0.18 part by weight to 0.22 part by weight. The fluorosurfactant may be, but not limited to, an oligomer containing a fluorine group, a hydrophilic group and a lipophilic group, for example, a commercially available Novec FC-4430 (purchased from 3M Company), FC-4434 (purchased from 3M Company), and MEGAFAC F-477 (purchased from DIC Corporation).

Preferably, the applicable organic solvent in the positive photoresist composition may be, but not limited to, 2-heptanone, propylene glycol monomethyl ether, propylene glycol monomethyl ether acetate, ethyl lactate, methyl ethyl ketone or combinations thereof. Preferably, the applicable organic solvent is 2-heptanone.

The disclosure further provides a method for forming the patterned polyimide layer, comprising the following steps:

coating a polyimide solution on a substrate to form a polyimide layer;

coating the positive photoresist composition on a polyimide layer to form a photoresist layer;

exposing and developing the photoresist layer with a developer to obtain a patterned photoresist layer, the patterned photoresist layer covering a portion of the polyimide layer;

stripping another portion of the polyimide layer that is not covered with the patterned photoresist layer by using a polyimide stripper; and removing the patterned photoresist layer by using a photoresist remover, so as to form a patterned polyimide layer.

By adopting the aforementioned technical means, the method for forming the patterned polyimide layer adopts the positive photoresist composition, so that the patterned photoresist layer can provide an improved protection to the low-dielectric polyimide layer in the manufacturing process, and the unprotected polyimide layer is stripped by a stripper for polyimide layer to optimize the manufacturing process and quality of the patterned polyimide layer.

Preferably, the step of coating the positive photoresist composition may be, but not limited to, a spin coating method, a spray coating method, a cast coating method or a roll coating method in the patterning process. Besides, the positive photoresist composition may be baked at a temperature between 80° C. and 120° C. after the coating step, so as to be dried into a photoresist layer.

Preferably, a photomask having a specific pattern may be used in the patterning process, and the light of the appropriate energy is irradiated on the photomask to perform an exposure step; and then the developer is used with an appropriate concentration to perform the developing step. The development step may be, but not limited to, for example, a dip development method or a spray development method. Besides, after the developing step and before the stripping step, the patterned photoresist layer and the polyimide layer under the patterned photoresist layer may be hard baked at a temperature of 80° C. to 120° C., preferably 100° C. to 110° C.

In the patterning process, the development step can be performed by using an existing developer. Preferably, the developer applicable to one or more embodiments may be an aqueous solution of tetramethylammonium hydroxide, and the concentration of tetramethylammonium hydroxide in the aqueous solution of tetramethylammonium hydroxide may be 3.5 wt % to 7 wt %, preferably, 3.5 wt % to 5 wt %, and more preferably 3.5 wt % or 5 wt %. According to one or more embodiments, if the concentration of the developer is less than 3.5 wt %, the time required for the development step is longer, which is accompanied by the phenomena of narrow line width and the photoresist residue; on the other hand, if the concentration of the developer exceeds 7 wt %, that will result in incidents such as peeling of the photoresist layer, excessive line width, or poor edge of the pattern. Therefore, by controlling the concentration of the developer, it is possible to improve performance and quality of patterning to obtain a desired line width.

Preferably, after the exposure and development steps, the polyimide layer not covered with the patterned photoresist layer may be further removed by using a polyimide stripper. Preferably, the polyimide stripper is not particularly limited and may be selected from various commercially available polyimide strippers, for example, PIC01 to PIC06 (purchased from EverDependUp Co., Ltd.), and its composition roughly contains 1 to 20 wt % of an organic amine compound, 5 wt % to 30 wt % of an organic nitrogen-containing compound and 50 wt % to 90 wt % of an aqueous ethylene glycol solution.

Preferably, the photoresist remover applicable to one or more embodiments may be, but not limited to, acetone, methyl ethyl ketone, 2-pentanone, 3-pentanone, propylene glycol monomethyl ether, propylene glycol monomethyl ether acetate, ethyl lactate or any combination thereof.

BRIEF DESCRIPTION OF THE DRAWING

The FIGURE is a schematic view of a manufacturing process of a patterned polyimide layer in accordance with one or more embodiments.

DETAILED DESCRIPTION OF THE PREFERRED EMBODIMENTS

Hereinafter, several embodiments are described to illustrate the implementation of the present invention; one skilled in the art can easily realize the advantages and effects of the present invention from the following specifications. Various modifications and variations could be made in order to practice or apply the present invention without departing from the spirit and scope of the invention.

Preparing a Positive Photoresist Composition

Various cresol-type novolac resins, diazonaphthoquinone-based sensitizers (1-phenol-4-(1-(4-(2-(4-(phenol)methyl)phenyl)propyl-2)phenyl)-1-(4-phenolyl phenyl)ethyl)phenyl diazonaphthoquinone derivative), fluorine surfactant (MEGAFAC F-477, purchased from the DIC Corporation) and the organic solvent (2-heptanone) were mixed in the amounts as shown in Table 1 below to prepare the positive photoresist compositions of Examples 1 to 3 and Comparative Examples 1 to 4, respectively. The characteristics of the cresol-type novolac resin used in each example and each comparative example are shown in Table 1 below.

The difference between the positive photoresist compositions of the examples and comparative examples was that the amount of the cresol-type novolac resin, the amount of the diazonaphthoquinone-based sensitizer, and the molar ratio of meta-cresol to para-cresol in the cresol-type novolac resin (shown as "the molar ratio of meta-cresol:para-cresol" in Table 1 below), the content of the free cresol in cresol-type novolac resin, the alkaline dissolution rate of the cresol-type novolac resin in an aqueous solution of 3.5 wt % tetramethylammonium hydroxide, and the weight average molecular weight (Mw) of the cresol-type novolac resin.

Table 1: Amounts of each component, the molar ratio of the meta-cresol:para-cresol in cresol-type novolac resin, the content of free cresol, ADR and Mw in the positive photoresist compositions of Examples 1 to 3 (EX1 to EX3) and Comparative Examples 1 to 4 (C1 to C4)

| description | EX1 | EX2 | EX3 | C1 | C2 | C3 | C4 |
|---|---|---|---|---|---|---|---|
| the molar ratio of the m-cresol:p-cresol | 6:4 | 7:3 | 3:7 | 7:3 | 6:4 | 6:4 | 6:4 |
| the content of freecresol | 1.6 wt % | 1.7 wt % | 1.5 wt % | 3.6 wt % | 1.6 wt % | 1.6 wt % | 1.9 wt % |
| ADR (TMAH3.5%) | 64 Å/s | 237 Å/s | 213 Å/s | 180 Å/s | 64 Å/s | 64 Å/s | 720 Å/s |
| Mw of cresol-type novolac resin | 12750 | 10576 | 11247 | 14886 | 12750 | 12750 | 5520 |
| Amount of cresol-type novolacresin (part by weight, PBW) | 100 | 100 | 100 | 100 | 100 | 100 | 100 |
| Amount of Sensitizer (PBW) | 55 | 45 | 55 | 55 | 35 | 65 | 55 |
| Amount of Additive (PBW) | 0.22 | 0.22 | 0.22 | 0.22 | 0.22 | 0.22 | 0.22 |
| Amount of Solvent (PBW) | 190 | 190 | 190 | 190 | 190 | 190 | 190 |

Method of Forming a Patterned Polyimide Layer

A positive photoresist composition prepared in Examples 1 to 3 and Comparative Examples 1 to 4 was used, and then sequentially underwent coating, exposing, developing, stripping, photoresist removing and other steps to form a patterned polyimide layer.

The method of forming a patterned polyimide layer in each of the examples and comparative examples was substantially the same, except that the positive photoresist compositions used were different, so as to compare the performance difference of the positive photoresist compositions of the different examples and comparative examples applied in the patterned polyimide layer. For the detailed method of forming the patterned polyimide layer, please refer to the FIGURE and the description of the following steps.

As shown in the FIGURE, an 8-inch silicon wafer 10 was prepared, formed thereon with a low-dielectric polyimide layer 20 having a thickness of 100 nm. The positive photoresist composition was coated on the polyimide layer 20 by using a spin-coating machine, and then heated at 100° C. for 2.5 minutes by using a baking sheet to obtain a uniform photoresist layer 30 with a thickness of 15 μm. Subsequently, the exposure step was performed by irradiating an appropriate energy on the photomask M by using an exposure machine, and then a development step was performed by using a 5% aqueous solution of tetramethylammonium hydroxide (developer) to obtain a patterned photoresist layer 30A. The patterned photoresist layer 30A was covered on a portion of the polyimide layer 20. Here, the total film thickness of the polyimide layer 20 and the patterned photoresist layer 30A was measured and recorded as "T1". Then the silicon wafer 10 with the polyimide layer 20 and the patterned photoresist layer 30A was heated at 110° C. for 5 minutes by using a baking sheet, and then was immersed in a polyimide stripper preheated to 50° C. (PIC01 sold by EverDependUp Co., Ltd.) for about 3 minutes, until a portion of the polyimide layer 20 (that is, the polyimide layer not covered by the patterned photoresist layer 30A) was removed. Here, the total film thickness of the polyimide layer 20 and the patterned photoresist layer 30A was measured and recorded as "T2". At last, the whole of the silicon wafer 10 after measuring the residual film percentage was immersed in acetone (photoresist remover) for 1 minute, and the process of forming the patterned polyimide layer was completed. A patterned polyimide layer 20A was formed on the silicon wafer 10.

The film thicknesses T1 and T2 of each of the examples and the comparative examples measured in the foresaid process were recorded in Table 2 below. The ratio of T2/T1 was defined as "residual film percentage", and the results were also shown in Table 2 below. The higher residual film percentage indicates the better chemical resistance of the photoresist layer to the polyimide stripper, which can improve the protective ability of the photoresist layer to the polyimide layer below.

In addition, after the processes of forming the patterned polyimide layer of each of the examples and the comparative examples, the surfaces of the respective patterned polyimide layers were separately observed by using an optical microscope to confirm whether there was a defect of photoresist residue on the patterned polyimide layer of Examples 1 to 3 and Comparative Examples 1 to 4. The observation results were also shown in Table 2 below. The observation can determine whether the photoresist layer is completely removed by the commonly-used photoresist remover as expected, so as to confirm the film quality of the patterned polyimide layer.

Table 2: The film thicknesses T1, T2 and residual film percentages measured with the polyimide layers patterned by the positive photoresist compositions of Examples 1 to 3 (EX1 to EX3) and Comparative Examples 1 to 4 (C1 to C4).

| | T1(μm) | T2(μm) | T2/T1(%) | Observation of the photoresist residues |
|---|---|---|---|---|
| EX 1 | 15.0 | 13.9 | 93 | None |
| EX 2 | 15.2 | 13.1 | 86 | None |
| EX 3 | 15.2 | 13.3 | 88 | None |
| C1 | 15.0 | 9.9 | 66 | None |
| C2 | 15.1 | 9.1 | 60 | None |
| C3 | — | — | — | None |
| C4 | 15.0 | 5.7 | 38 | None |

According to the results shown in Tables 1 and 2 above, if the positive photoresist composition has the following characteristics: (1) the positive photoresist composition has 100 parts by weight of cresol-type novolac resin and 40 to 60 parts by weight of diazonaphthoquinone-based sensitizer, (2) the content of free cresol in the cresol-type novolac resin is less than 2 wt %, and (3) the ADR (TMAH 3.5%) of the cresol-type novolac resin is lower than 285 Å/s, then for example, the residual film percentage of the positive photoresist composition of the Examples 1 to 3 can be measured to be at least 80%, and the overall photoresist layer can be easily removed in the patterning process by the photoresist remover commonly-used in the market, without the phenomenon of photoresist residue. On the other hand, in the absence of at least one of the foresaid features, for example, the corresponding residual film percentage of the positive photoresist compositions of Comparative Examples 1 to 4 described above was remarkably decreased, indicating that the photoresist layers in the positive photoresist compositions of Comparative Examples 1 to 4 were insufficient in chemical resistance to the polyimide strippers and the polyimide layer underneath cannot be protected as expected, and thereby the polyimide stripper was able to etch the polyimide layer covered by the patterned photoresist layer and this resulted in a remarkably lower residual film percentage, even film breakage in Comparative Example 3.

Further investigating the positive photoresist composition of each comparative example, it is concluded that since the content of free cresol of the cresol-type novolac resin in the positive photoresist composition of Comparative Example 1 had exceeded 2 wt %, the residual film percentage was only 66%; the cresol-type novolac resin in the positive photoresist composition of Comparative Example 2 and Comparative Example 3 was the same as that of Example 1, but the amount of the naphthoquinone sensitizer in the positive photoresist composition of Comparative Example 2 had been lower than the limit value of 40 wt %, so the residual film percentage was only 60%; the amount of the naphthoquinone sensitizer in the positive photoresist composition of Comparative Example 3 had exceeded the limit value of 60 wt %, so that occurring sensitizer precipitation in the process for the positive photoresist composition of Comparative Example 3 and cannot be used; and the ADR of the cresol-type novolac resin in the positive type photoresist composition of Comparative Example 4 was too high, and the residual film percentage was only 38%.

It has been confirmed by experimental results that if the positive photoresist composition has the following characteristics: (1) the positive photoresist composition has 100 parts by weight of cresol-type novolac resin and 40 to 60 parts by weight of diazonaphthoquinone-based sensitizer, (2) the content of free cresol in the cresol-type novolac resin is less than 2 wt %, and (3) the ADR (TMAH 3.5%) of the cresol-type novolac resin is lower than 285 Å/s, then the formed photoresist layer not only has high peelability and avoids photoresist residues in the process, but also optimizes the chemical resistance of the photoresist layer to the polyimide strippers, and enables the photoresist layer to protect the polyimide layer underneath effectively in wet etching, and thereby achieving the purpose of patterning the low-dielectric polyimide layer. Even though numerous characteristics and advantages of the present invention have been set forth in the foregoing description, together with details of the structure and features of the invention, the disclosure is illustrative only. Changes may be made in the details, especially in matters of characteristic, range, and species of parts within the principles of the invention to the full extent indicated by the broad general meaning of the terms in which the appended claims are expressed.

What is claimed is:

1. A method for forming a patterned polyimide layer, comprising the following steps:
   coating a polyimide solution on a substrate to form a polyimide layer;
   coating a positive photoresist composition on the polyimide layer, so as to form a photoresist layer;
   exposing and developing the photoresist layer with a developer to obtain a patterned photoresist layer, the patterned photoresist layer covering a portion of the polyimide layer;
   baking the patterned photoresist layer and the polyimide layer at a temperature ranging from 80° C. to 120° C.;
   stripping another portion of the polyimide layer that is not covered with the patterned photoresist layer by using a polyimide stripper; and
   removing the patterned photoresist layer by using a photoresist remover, so as to form a patterned polyimide layer;
   wherein the baking step is performed between the developing step and the stripping step;
   wherein the positive photoresist composition comprises a cresol-type novolac resin, a diazonaphthoquinone-based sensitizer and an organic solvent; based on the cresol-type novolac resin with a total amount of 100 parts by weight, the amount of the diazonaphthoquinone-based sensitizer ranging from 40 parts to 60 parts by weight, the content of the free cresol in the cresol-type novolac resin being lower than 2 wt %, and the alkaline dissolution rate(ADR) of the cresol-type novolac resin in an aqueous solution of 3.5 wt % to 7 wt % tetramethylammonium hydroxide being lower than 285 Å/s, and
   wherein the developer is an aqueous solution of tetramethylammonium hydroxide with a concentration of 3.5 wt % to 7 wt %.

2. The method as claimed in claim 1, wherein the photoresist remover contains acetone, methyl ethyl ketone, 2-pentanone, 3-pentanone, propylene glycol monomethyl ether, propylene glycol monomethyl ether acetate, ethyl lactate or any combination thereof.

3. The method as claimed in claim 1, wherein the polyimide stripper contains 1 wt % to 20 wt % of an organic amine compound, 5 wt % to 30 wt % of an organic nitrogen-containing compound and 50 wt % to 90 wt % of an aqueous ethylene glycol solution.

4. The method as claimed in claim 1, wherein the cresol-type novolac resin of the positive photoresist composition has a weight average molecular weight of 10,000 to 40,000.

5. The method as claimed in claim 1, wherein the amount of the diazonaphthoquinone-based sensitizer of the positive photoresist composition ranges from 45 parts to 55 parts by weight based on the cresol-type novolac resin with the total amount of 100 parts by weight.

6. The method as claimed in claim 1, wherein the positive photoresist composition comprises a fluorosurfactant.

7. The method as claimed in claim 1, wherein the amount of the organic solvent of the positive photoresist composition is 100 parts by weight to 500 parts by weight based on the cresol-type novolac resin with the total amount of 100 parts by weight.

8. The method as claimed in claim 1, wherein the organic solvent of the positive photoresist composition contains 2-heptanone, propylene glycol monomethyl ether, propylene glycol monomethyl ether acetate, ethyl lactate, methyl ethyl ketone or any combinations thereof.

9. A method for forming a patterned polyimide layer, comprising the following steps:
- coating a polyimide solution on a substrate to form a polyimide layer;
- coating a positive photoresist composition on the polyimide layer, so as to form a photoresist layer;
- exposing and developing the photoresist layer with a developer to obtain a patterned photoresist layer, the patterned photoresist layer covering a portion of the polyimide layer;
- stripping another portion of the polyimide layer that is not covered with the patterned photoresist layer by using a polyimide stripper, wherein the polyimide stripper contains 1 wt % to 20 wt % of an organic amine compound, 5 wt % to 30 wt % of an organic nitrogen-containing compound and 50 wt % to 90 wt % of an aqueous ethylene glycol solution; and
- removing the patterned photoresist layer by using a photoresist remover, so as to form a patterned polyimide layer;
- wherein the positive photoresist composition comprises a cresol-type novolac resin, a diazonaphthoquinone-based sensitizer and an organic solvent; based on the cresol-type novolac resin with a total amount of 100 parts by weight, the amount of the diazonaphthoquinone-based sensitizer ranging from 40 parts to 60 parts by weight, the content of the free cresol in the cresol-type novolac resin being lower than 2 wt %, and the alkaline dissolution rate(ADR) of the cresol-type novolac resin in an aqueous solution of 3.5 wt % to 7 wt % tetramethylammonium hydroxide being lower than 285 Å/s, and
- wherein the developer is an aqueous solution of tetramethylammonium hydroxide with a concentration of 3.5 wt % to 7 wt %.

10. The method as claimed in claim 9, wherein the photoresist remover contains acetone, methyl ethyl ketone, 2-pentanone, 3-pentanone, propylene glycol monomethyl ether, propylene glycol monomethyl ether acetate, ethyl lactate or any combination thereof.

11. The method as claimed in claim 9, wherein the cresol-type novolac resin of the positive photoresist composition has a weight average molecular weight of 10,000 to 40,000.

12. The method as claimed in claim 9, wherein the amount of the diazonaphthoquinone-based sensitizer of the positive photoresist composition ranges from 45 parts to 55 parts by weight based on the cresol-type novolac resin with the total amount of 100 parts by weight.

13. The method as claimed in claim 9, wherein the positive photoresist composition comprises a fluorosurfactant.

14. The method as claimed in claim 9, wherein the amount of the organic solvent of the positive photoresist composition is 100 parts by weight to 500 parts by weight based on the cresol-type novolac resin with the total amount of 100 parts by weight.

15. The method as claimed in claim 9, wherein the organic solvent of the positive photoresist composition contains 2-heptanone, propylene glycol monomethyl ether, propylene glycol monomethyl ether acetate, ethyl lactate, methyl ethyl ketone or any combinations thereof.

* * * * *